(12) United States Patent
Wallichs et al.

(10) Patent No.: US 11,121,715 B2
(45) Date of Patent: *Sep. 14, 2021

(54) COARSE-GRAIN PROGRAMMABLE ROUTING NETWORK FOR LOGIC DEVICES

(71) Applicant: Intel Corporation, Santa Clara, CA (US)

(72) Inventors: Gary Wallichs, San Jose, CA (US); Sean Atsatt, San Jose, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/777,375

(22) Filed: Jan. 30, 2020

(65) Prior Publication Data

US 2020/0395942 A1 Dec. 17, 2020

Related U.S. Application Data

(63) Continuation of application No. 16/439,577, filed on Jun. 12, 2019, now Pat. No. 10,587,270.

(51) Int. Cl.
*H03K 19/17736* (2020.01)
*H03K 19/1776* (2020.01)
*H03K 19/00* (2006.01)
*H03K 19/17704* (2020.01)

(52) U.S. Cl.
CPC ... *H03K 19/17736* (2013.01); *H03K 19/0008* (2013.01); *H03K 19/1776* (2013.01); *H03K 19/17704* (2013.01)

(58) Field of Classification Search
None
See application file for complete search history.

(56) References Cited

U.S. PATENT DOCUMENTS

| | | |
|---|---|---|
| 5,457,410 A | 10/1995 | Ting |
| 5,787,007 A | 7/1998 | Bauer |
| 6,072,233 A | 6/2000 | Corisis et al. |
| 6,604,230 B1 | 8/2003 | Khalid et al. |
| 6,809,551 B1 * | 10/2004 | Wicker, Jr. ....... H03K 19/17732 326/38 |
| 6,842,034 B1 | 1/2005 | Chan et al. |

(Continued)

OTHER PUBLICATIONS

Subbaredy et al., U.S. Appl. No. 16/123,765, filed Sep. 6, 2018.

*Primary Examiner* — Jany Richardson
(74) *Attorney, Agent, or Firm* — Fletcher Yoder, P.C.

(57) ABSTRACT

Circuitry is provided that includes programmable fabric with fine-grain routing wires and a separate programmable coarse-grain routing network that provides enhanced bandwidth, low latency, and deterministic routing behavior. The programmable coarse-grain routing network may be implemented on an active interposer die. The programmable fabric may be implemented on a top die that is stacked on the active interposer die. A protocol-based network on chip (NoC) may be overlaid on the coarse-grain routing network. Although the NoC protocol is nondeterministic, the coarse-grain routing network includes an array of programmable switch boxes linked together using a predetermined number of routing channels to provide deterministic routing. Pipeline registers may be interposed within the routing channels at fixed locations to guarantee timing closure.

20 Claims, 10 Drawing Sheets

(56) References Cited

U.S. PATENT DOCUMENTS

| | | |
|---|---|---|
| 7,536,669 B1 | 5/2009 | Anderson |
| 7,619,441 B1 | 11/2009 | Rahman et al. |
| 8,159,973 B2 | 4/2012 | Deng et al. |
| 8,201,129 B2 | 6/2012 | Lee et al. |
| 8,542,032 B1 | 9/2013 | Hutton et al. |
| 8,860,460 B1 | 10/2014 | Cashman |
| 8,922,243 B2 | 12/2014 | Jayasena et al. |
| 9,099,999 B1 | 8/2015 | Wang et al. |
| 9,106,229 B1 | 8/2015 | Hutton et al. |
| 9,129,935 B1 | 9/2015 | Chandrasekar et al. |
| 9,294,092 B2 | 3/2016 | Hutton |
| 9,344,091 B2 | 5/2016 | Jayesena et al. |
| 9,633,872 B2 | 4/2017 | Chen et al. |
| 9,847,783 B1 | 12/2017 | Teh et al. |
| 9,935,052 B1 | 4/2018 | Liu et al. |
| 2006/0119384 A1 | 6/2006 | Camarota et al. |
| 2009/0224800 A1* | 9/2009 | Lee ..................... H03K 19/177 326/41 |
| 2013/0181257 A1 | 7/2013 | Ngai |
| 2014/0181458 A1 | 6/2014 | Loh et al. |
| 2014/0210097 A1* | 7/2014 | Chen ..................... H01L 21/50 257/774 |
| 2016/0026742 A1 | 1/2016 | Schelle et al. |
| 2017/0244414 A1* | 8/2017 | Niu ................. H03K 19/17752 |
| 2018/0176006 A1 | 6/2018 | McElheny et al. |
| 2019/0044515 A1 | 2/2019 | Gutala et al. |

* cited by examiner 0 1 2 3 0 1 2 3 ...

COARSE-GRAIN PROGRAMMABLE ROUTING NETWORK FOR LOGIC DEVICES

This application is a continuation of U.S. patent application Ser. No. 16/439,577, filed Jun. 12, 2019, which is hereby incorporated by reference herein in its entirety.

BACKGROUND

This relates generally to integrated circuits and more particularly, to programmable integrated circuits.

Programmable integrated circuits are a type of integrated circuit that can be programmed by a user to implement a desired custom logic function. In a typical scenario, a logic designer uses computer-aided design tools to design a custom logic circuit. When the design process is complete, the computer-aided design tools generate configuration data. The configuration data is then loaded into memory elements on a programmable integrated circuit device to configure that device to perform the functions of the custom logic circuit. Such types of programmable integrated circuits are sometimes referred to as a field-programmable gate array (FPGA).

FGPAs typically include input-output (I/O) components for communicating with external devices using I/O standards such as the PCIe (Peripheral Component Interconnect Express) protocol, the IEEE 802.3 Ethernet protocol, and double data rate (DDR) external memory interface protocols. Such external interface protocols are doubling in terms of bandwidth every two to three years. On the other hand, the performance improvement of conventional FPGA routing fabric does not scale at similar rates and is limited to around 10-15% per generation, thus becoming performance bottlenecks for FPGAs.

It is within this context that the embodiments described herein arise.

BRIEF DESCRIPTION OF THE DRAWINGS

FIGS. 9A, 9B, and 9C are diagrams showing values that can be output by time-domain multiplexing (TDM) counters when supporting the various modes shown in FIG. 8 in accordance with some embodiments.

DETAILED DESCRIPTION

The present embodiments relate to programmable integrated circuits, and in particular, to programmable integrated circuits having a programmable coarse-grain routing network that provides deterministic pre-wired routing interconnects offering guaranteed timing closure and register pipelines at fixed locations to satisfy a target maximum operating frequency in a wide range of computing applications.

Use of a separate dedicated programmable coarse-grain routing network in addition to existing fine-grained routing wires on a programmable integrated circuit (IC) provides a tangible improvement to computer technology by enabling more efficient high-bandwidth data movement and increased parallelism between the programmable fabric on the IC and external components, allowing late binding decisions for various use cases while not precluding high level protocol overlays such as a network on chip (NoC) or memory-mapped network, permitting efficient sharing of routing channels for independent traffic flows, and empowering deterministic data streaming between different endpoints (e.g., between different sources and destinations).

It will be recognized by one skilled in the art, that the present exemplary embodiments may be practiced without some or all of these specific details. In other instances, well-known operations have not been described in detail in order not to unnecessarily obscure the present embodiments.

Figure 1:
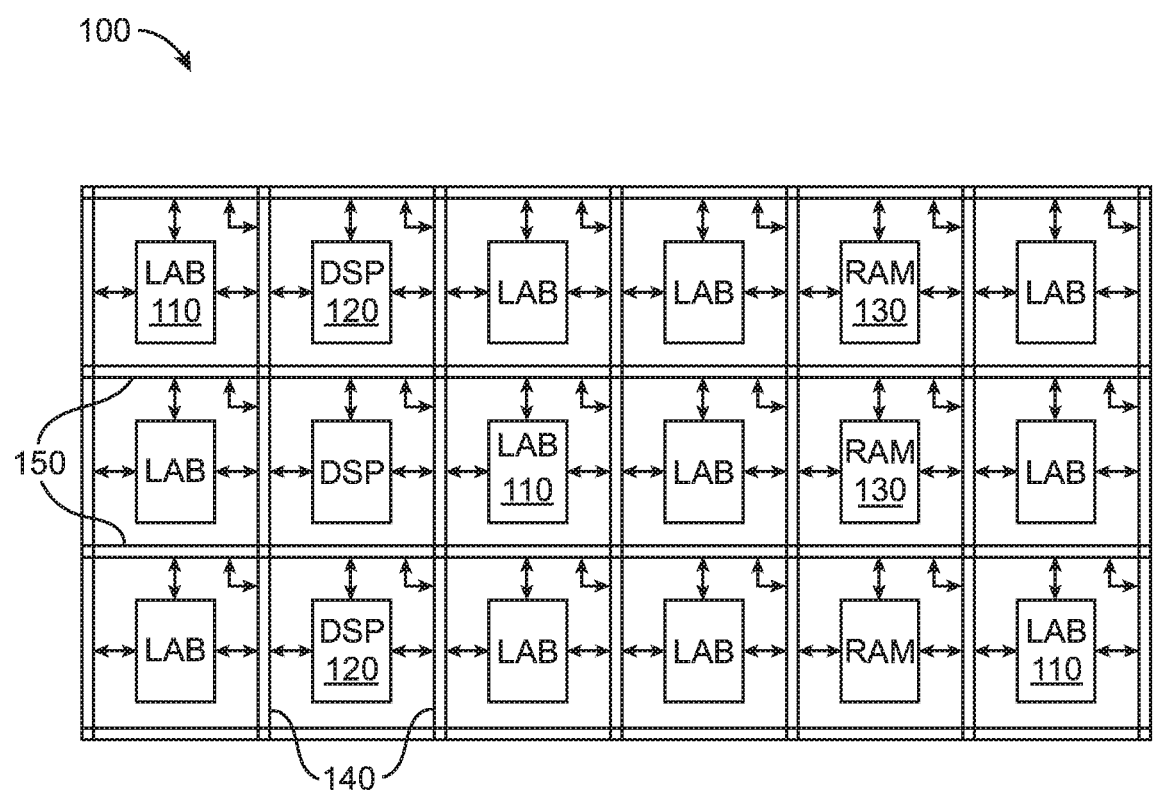
FIG. 1 is a diagram of illustrative programmable integrated circuitry in accordance with an embodiment.

An illustrative embodiment of programmable integrated circuit circuitry 100 such as a programmable logic device (PLD) or a field-programmable gate array (FPGA) that may be configured to implement a circuit design is shown in FIG. 1. As shown in FIG. 1, circuitry 100 may include a two-dimensional array of functional blocks, including logic array blocks (LABs) 110 and other functional blocks such as random access memory (RAM) blocks 130 and digital signal processing (DSP) blocks 120, for example.

Functional blocks such as LABs 110 may include smaller programmable regions (e.g., logic elements, configurable logic blocks, or adaptive logic modules) that receive input signals and perform custom functions on the input signals to produce output signals. LABs 110 may also be grouped into larger programmable regions sometimes referred to as logic sectors that are individually managed and configured by corresponding logic sector managers. The grouping of the programmable logic resources on device 100 into logic sectors, logic array blocks, logic elements, or adaptive logic modules is merely illustrative. In general, circuitry 100 may include functional logic blocks of any suitable size and type, which may be organized in accordance with any suitable logic resource hierarchy.

Circuitry 100 may contain programmable memory elements. These memory elements may be loaded with configuration data (also called programming data). Once loaded, the memory elements each provide a corresponding static control signal that controls the operation of an associated functional block (e.g., LABs 110, DSP 120, RAM 130, etc.). In a typical scenario, the outputs of the loaded memory elements are applied to the gates of metal-oxide-semiconductor transistors in a functional block to turn certain transistors on or off and thereby configure the logic in the functional block including the routing paths. Programmable logic circuit elements that may be controlled in this way include parts of multiplexers (e.g., multiplexers used for forming routing paths in interconnect circuits), look-up tables, logic arrays, AND, OR, NAND, and NOR logic gates, pass gates, etc.

The memory elements may use any suitable volatile and/or non-volatile memory structures such as random-access-memory (RAM) cells, fuses, antifuses, programmable read-only-memory memory cells, mask-programmed and laser-programmed structures, combinations of these structures, etc. Because the memory elements are loaded with configuration data during programming, the memory elements are sometimes referred to as configuration memory, configuration random-access memory (CRAM), or programmable memory elements. Circuitry 100 may be configured to implement a custom circuit design. For example, the configuration RAM may be programmed such that LABs 110, DSP 120, and RAM 130, and programmable interconnect circuitry (i.e., vertical channels 140 and horizontal channels 150) form the circuit design implementation.

In addition, the programmable logic device may further include input-output (I/O) elements (not shown) for driving signals off of circuitry 100 and for receiving signals from other devices. The input-output elements may include parallel input-output circuitry, serial data transceiver circuitry, differential receiver and transmitter circuitry, or other circuitry used to connect one integrated circuit device to another.

As described above, circuitry 100 may also include programmable interconnect circuitry in the form of vertical routing channels 140 and horizontal routing channels 150, each routing channel including at least one track to route at least one or more wires. If desired, the interconnect circuitry may include pipeline elements, and the contents stored in these pipeline elements may be accessed during operation.

Note that other routing topologies, besides the topology of the interconnect circuitry depicted in FIG. 1, are intended to be included within the scope of the present invention. For example, the routing topology may include wires that travel diagonally or that travel horizontally and vertically along different parts as well as wires that are perpendicular to the device plane in the case of three dimensional integrated circuits, and the driver of a wire may be located at a different point than one end of a wire. The routing topology may include global wires that span substantially all of circuitry 100, fractional global wires such as wires that span part of circuitry 100, staggered wires of a particular length, smaller local wires, or any other suitable interconnection resource arrangement.

As described above in connection with FIG. 1, circuitry 100 may implement a programmable integrated circuit such as a field programmable gate array (FPGA). Configurations in which an FPGA is provided with a dedicated programmable coarse-grain routing network may sometimes be described herein as an example. This is, however, merely illustrative. In general, the structures, methods, and techniques described herein may be extended to other suitable types of integrated circuits.

The horizontal routing wires 140 and vertical routing wires 150 that are used to interconnect the various functional blocks within an FPGA are sometimes referred to as "fine-grain" routing wires. Fine-grain routing wires are programmable with bit-level granularity. As the speed of external input-output interface protocols continues to double every two to three years, the performance improvement of fine-grain FPGA routing interconnect is, however, limited to only 10-15% per generation of devices due to semiconductor parasitics (i.e., parasitic capacitance and resistance) and metal width and spacing requirements, all of which limits maximum frequency (Fmax) gains. Also, since the fine-grain routing is used to distribute both local and global wires, packing large related bus networks together will reduce the number of routing wires available for traditional FPGA logic inter-logic-element connectivity.

FPGAs may also be provided with dedicated fixed-function network on chip (NoC) fabric, which can offer higher bandwidth capacity but imposed additional overhead and tradeoffs. For instance, NoC fabric interconnects include additional overhead required for implementing credit throttling, backpressure, and bridging required of NoC-based protocols such as the AXI NoC interface protocol. Other problems associated with NoC-based fabric are that its routing may be nondeterministic and that the bandwidth allocation is inflexible and complex.

Figure 2:
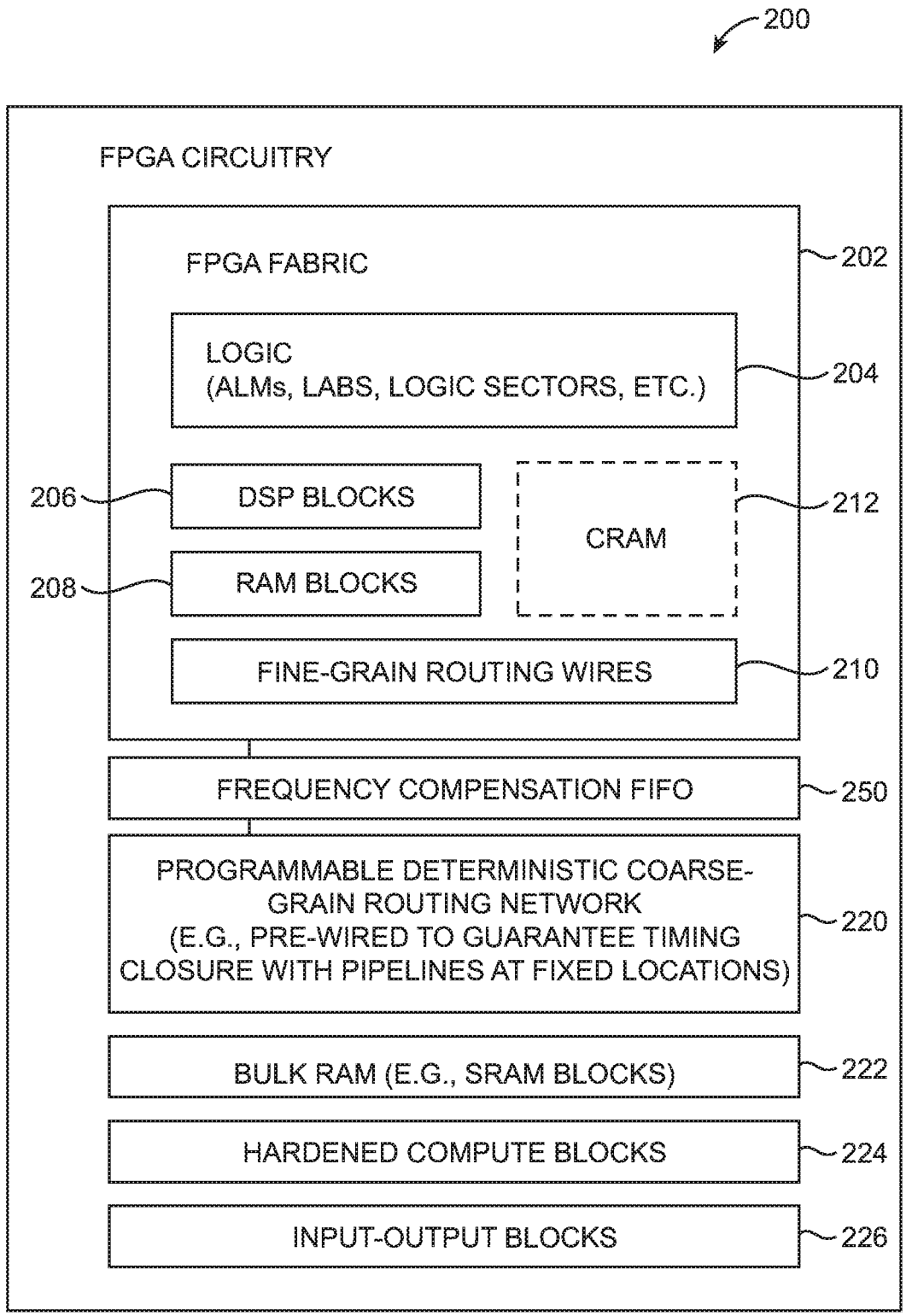
FIG. 2 is a diagram showing how programmable integrated circuitry includes fine-grain routing wires and a separate programmable deterministic coarse-grain routing network in accordance with an embodiment.

In accordance with an embodiment, FIG. 2 is a diagram showing how programmable integrated circuitry such as FPGA circuitry 200 may include fine-grain routing wires and a separate programmable deterministic coarse-grain routing network. As shown in FIG. 2, FPGA circuitry 200 may include logic circuitry 204 (e.g., organized into adaptive logic modules, logic elements, logic array blocks, logic sectors, etc.), DSP blocks 206 (see, e.g., DSP blocks 120 of FIG. 1), RAM blocks 208 (see, e.g., RAM blocks 130 of FIG. 1), and fine-grain routing wires 210. The logic circuitry 204, DSP blocks 206, RAM blocks 208, and fine-grain routing wires 210 may sometimes be referred to collectively as FPGA fabric 202, core fabric circuitry, or storage, processing, and routing fabric. FPGA fabric 202 may include embedded memory elements such as configuration random-access memory (CRAM) cells 212 that output static control signals for configuring the various logic, arithmetic, memory, and fine-grain routing circuitry within fabric 202.

The FPGA circuitry 200 may further include a programmable deterministic coarse-grain routing network such as programmable coarse-grain routing network 220, additional memory such as bulk RAM 222, additional compute circuits such as hardened compute blocks 224, and input-output (I/O) blocks 226. The IO blocks 226 are configured to communicate with devices external to FPGA circuitry 200. For example, IO blocks 226 may include a hardened Peripheral Component Interconnect (PCIe) interface block, an IEEE 802.3 Ethernet block, a Universal Serial Bus (USB) block, an Interlaken block, a RapidIO block, a Common Public Radio Interface (CPRI) block, and/or other computer bus protocol interfacing blocks.

In comparison to RAM blocks 208 within core fabric 202, bulk RAM 222 are much larger random-access memory blocks sometimes referred to as embedded static random-access memory (eSRAM) blocks. The bulk RAM blocks 222 tend to be much larger and denser than the core RAM blocks 208 while incurring relatively longer memory access latencies. For example, bulk RAM 222 may be used as a memory cache for an associated processor, may be used to store configuration data (e.g., a configuration bitstream or a CRAM image), or may be used to store other user data. Similarly, in comparison to DSP blocks 206 within core fabric 202, compute blocks 224 may be much larger and denser. For example, compute blocks 224 may be hardwired to perform multiply-accumulate operations, to compute dot products, to perform any suitable arithmetic function, and/or to provide any desired computing capability.

In particular, programmable coarse-grain routing network 220 can be used to address the needs of programmable IC designs that require the use of deterministic global routing interconnects and/or NoC-type fabric networks. Fine-grain routing wires 210 that traditionally implement local and global routing within the FPGA fabric have variable routing lengths and pipelining locations that are programmable (i.e., the fine-grain routing wires have lengths and pipelining locations that are not fixed). A design compiler tool for compiling an FPGA design must attempt to meet a target Fmax requirement with no guarantees. Shorter fine-grain wires are cascaded together to form longer wires and must arrive at a reasonably close register to meet timing requirements. Moreover, multi-bit buses in a fine-grain routing configuration may all take different routing paths before arriving at the same final destination. The various paths that can be taken could also change from one design compilation to another. In other words, fine-grain routing is non-deterministic. In contrast, multi-bit buses in the coarse-grain routing network 220 may all take the same routing path on the interposer die.

In contrast to the fine-grain routing wires 210, programmable coarse-grain routing network 220 is programmable with byte-level, word-level, or other multibit-wide granularity and is a deterministic routing network with pipelines at fixed locations to satisfy a target operating frequency. The 8-bit granularity provides the least common coarse-grain width, which is capable of supporting the needs of different computes variables (8/16/32/64 bits) as well as the most commonly used memory and IC data path widths. The term "deterministic" indicates that the network 220 will be able to determine at which clock cycle an event will occur with certainty. Unlike the fine-grain routing wires 210, interconnects within the coarse-grain routing network 220 is pre-wired to ensure timing closure (e.g., the routing channels within network 220 are guaranteed in terms of timing and inter-bus skew).

The pipeline registers within coarse-grain routing network 220 may be timed using a single dedicated synchronous network clock distributed across network 220. To help minimize dynamic power consumption, unused or idle routing channels within network 220 may be statically gated. Data transfers from FPGA fabric 202 or IO blocks 226 to coarse-grain routing network 220, which belong to different clock domains, will need to pass through phase or frequency compensation first-in first-out (FIFO) circuits 250 (sometimes also referred to as rate matching FIFOs). Coarse-gain routing network 220 may also provide clock tap points into one or more IO blocks 226 and core fabric 202 for use in building interface logic.

As integrated circuit technology scales towards smaller device dimensions, device performance continues to improve at the expense of increased power consumption. In an effort to reduce power consumption, more than one die may be placed within a single integrated circuit package (i.e., a multichip package). As different types of devices cater to different types of applications, more dies may be required in some systems to meet the requirements of high performance applications. Accordingly, to obtain better performance and higher density, an integrated circuit package may include multiple dies arranged laterally along the same plane or may include multiple dies stacked on top of one another (sometimes referred to as 3-dimension or "3D die stacking").

Figure 3:
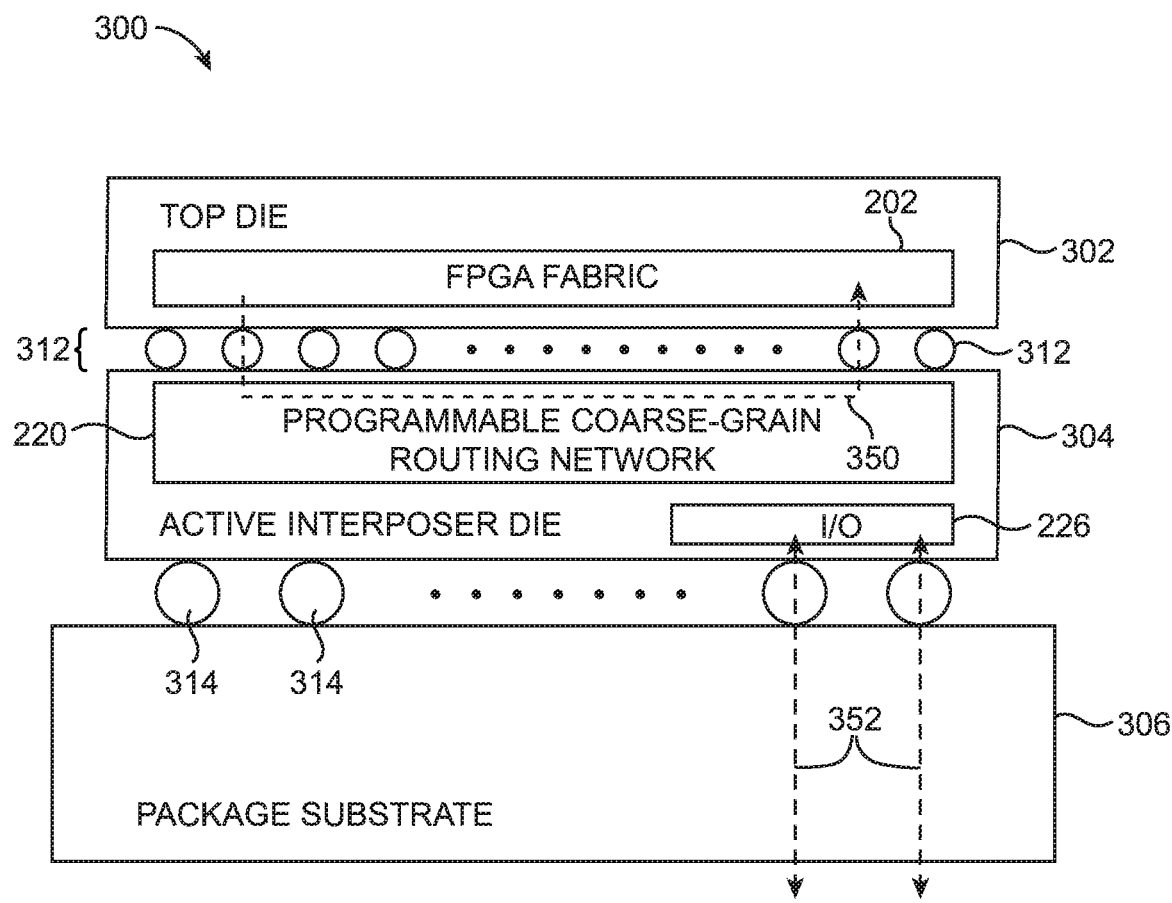
FIG. 3 is a cross-sectional side view of an illustrative 3-dimensional (3D) stacked multichip package in accordance with an embodiment.

Technologies such as 3D stacking have enabled a new dimension for building heterogeneous products by utilizing one of the stacked dies to expand memory capacity, compute power, and also interconnect capacity to help FPGAs keep pace and scale with external IO interface protocols. FIG. 3 shows a cross-sectional side view of an illustrative multichip package 300 that includes a package substrate 306, an active interposer die 304 mounted on package substrate 306, and an integrated circuit (IC) die 302 mounted on top of active interposer 304. As shown in FIG. 3, the FPGA fabric 202 (e.g., programmable logic 204, DSP blocks 206, RAM blocks 208, fine-grain routing wires 210, and associated CRAM cells 212 of FIG. 2) may be formed on the top IC die 302.

Microbumps 312 may be formed between dies 302 and 304 to help couple the circuitry on die 302 to the circuitry on die 304. Bumps such as controlled collapse chip connection (C4) bumps 314 (sometimes referred to as flip-chip bumps) may be formed at the bottom surface of interposer 304. Generally, C4 bumps 314 (e.g., bumps used for interfacing with off-package components) are substantially larger in size compared to microbumps 312 (e.g., bumps used for interfacing with other dies within the same multichip package). The number of microbumps 312 is also generally much greater than the number of flip-chip bumps 314 (e.g., the ratio of the number of microbumps to the number of C4 bumps may be greater than 2:1, 5:1, 10:1, etc.).

Separately, programmable coarse-grain routing network 220 may be formed on the bottom interposer die 304. Additional IC dies (not shown) may optionally be mounted on active interposer die 304 beside top die 302. By forming the coarse-grain routing network 220 as a separate component from the top FPGA die 302, any global or longer-reach routing paths spanning a larger number of logic regions (e.g., spanning five or more logic array blocks) can be passed down to routing network 220 and then back up to an appropriate remote destination on top die 302 as shown by coarse-grain routing path 350.

Dedicating coarse-grain routing network 220 to perform global routing allows the fine-grain routing wires 210 on the top die 302 to only focus on handling local or short-reach routing paths. Offloading deterministic, pipelined, coarse-grain routing in this way provides an improvement to integrated circuit performance by enabling more efficient high-bandwidth data movement within the FPGA circuitry and also on and off the FPGA, by allowing late binding decisions for FGPA use cases while not precluding higher level protocol overlays such as a network on chip, by permitting efficient sharing of wires for different independent traffic flows, by allowing flexible scalability to achieve the desired parallelism and bandwidth, and by providing deterministic data streaming between endpoints using a fixed pre-wired pipelined channel structure.

One or more bulk RAM blocks 222, hardened compute blocks 224, and/or IO blocks described in connection with FIG. 2 may be formed on active interposer die 304. Referring back again to FIG. 3, an IO block 226 within the bottom interposer die 304 may be configured to interface with components external to multichip package 300, as indicated by communications paths 352.

The example of FIG. 3 in which programmable coarse-grain routing network 220 is formed on a separate 3D stacked die relative to FPGA die 302 is merely illustrative. If desired, coarse-grain routing network 220 could be formed in different regions as fabric 202 on the same die, could be overlaid on top of fabric 202 in different metal routing layers of the same die, may be formed on separate 2D laterally mounted dies, may be formed as part of different IC packages, tec.

Figure 4:
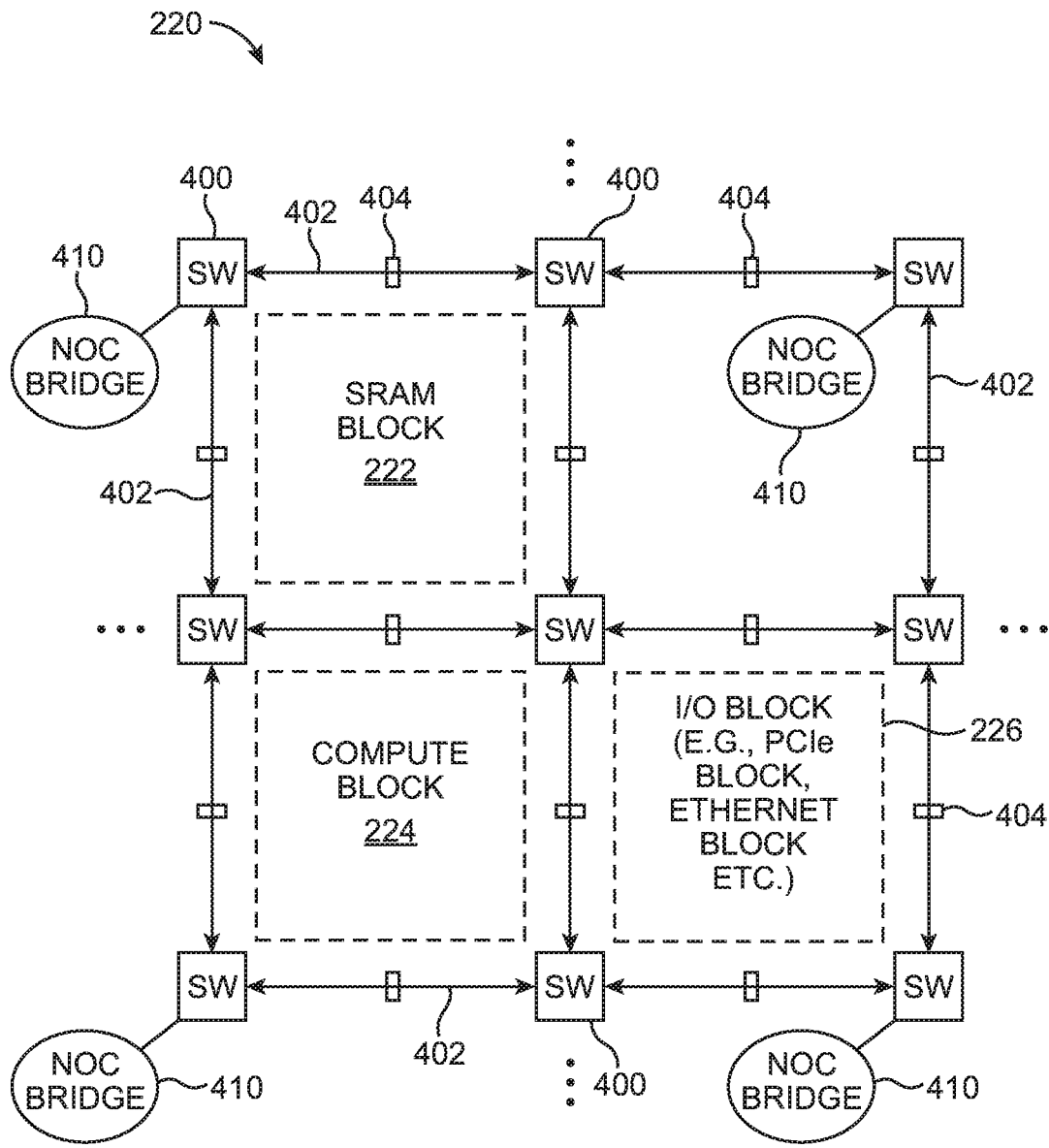
FIG. 4 is a diagram of an illustrative programmable coarse-grain routing network that includes an array of programmable switch box circuits in accordance with an embodiment.

FIG. 4 shows one suitable arrangement in which programmable coarse-grain routing network 220 is built using an array of programmable switch box circuits 400 forming a grid of multiple byte-sized, pipelined channels. A shown in FIG. 4, programmable coarse-grain routing network 220 may include rows and columns of programmable switch box circuits 400. Each adjacent pair of switch box circuits 400 may be linked together via multiple channels 402. The channels 402 may be pipelined at fixed locations using pipeline registers 404.

The plurality of switch box circuits 400 and channels 320 may create a grid or matrix of routing paths forming openings or slots surrounded by four neighboring channels 402. In the example of FIG. 4, the opening in the northwest quadrant may be occupied by a bulk SRAM block 222; the opening in the southwest quadrant may be occupied by a compute block 224; the opening in the southeast quadrant may be occupied by an IC block 266 (e.g., a PCIe block or an Ethernet block); and the slot in the northeast quadrant may be unoccupied. This exemplary arrangement in which network 220 includes a 3-by-3 array of programmable switch box circuits 400 is merely illustrative. In general, network 220 may include an array of any suitable dimension with tens, hundreds, or even thousands of programmable switch box circuits 400 forming grid openings at least some of which are occupied by storage, compute, and/or input-output circuitry.

Still referring to FIG. 4, a protocol-based network on chip (NoC) may be overlaid on the coarse-grain routing network 220. In other words, programmable coarse-grain routing network 220 may be configured and reused for the NoC protocol. The NoC protocol is a predefined routing protocol that is non-deterministic and does not guarantee time of delivery. When implementing the NoC protocol, one or more switch box circuits 400 within coarse-grain routing network 220 may communicate with one or more NoC bridges 410 that are formed in the top FPGA die 302. In the example of FIG. 4, four out of the nine switch box circuits 400 are coupled to a corresponding NoC bridge 410 (e.g., an AXI bridge or an Avalon bridge). This is merely illustrative. In general, any suitable subset of switch box circuits 400 may be coupled to its own associated NoC bridge 410.

Figure 5:
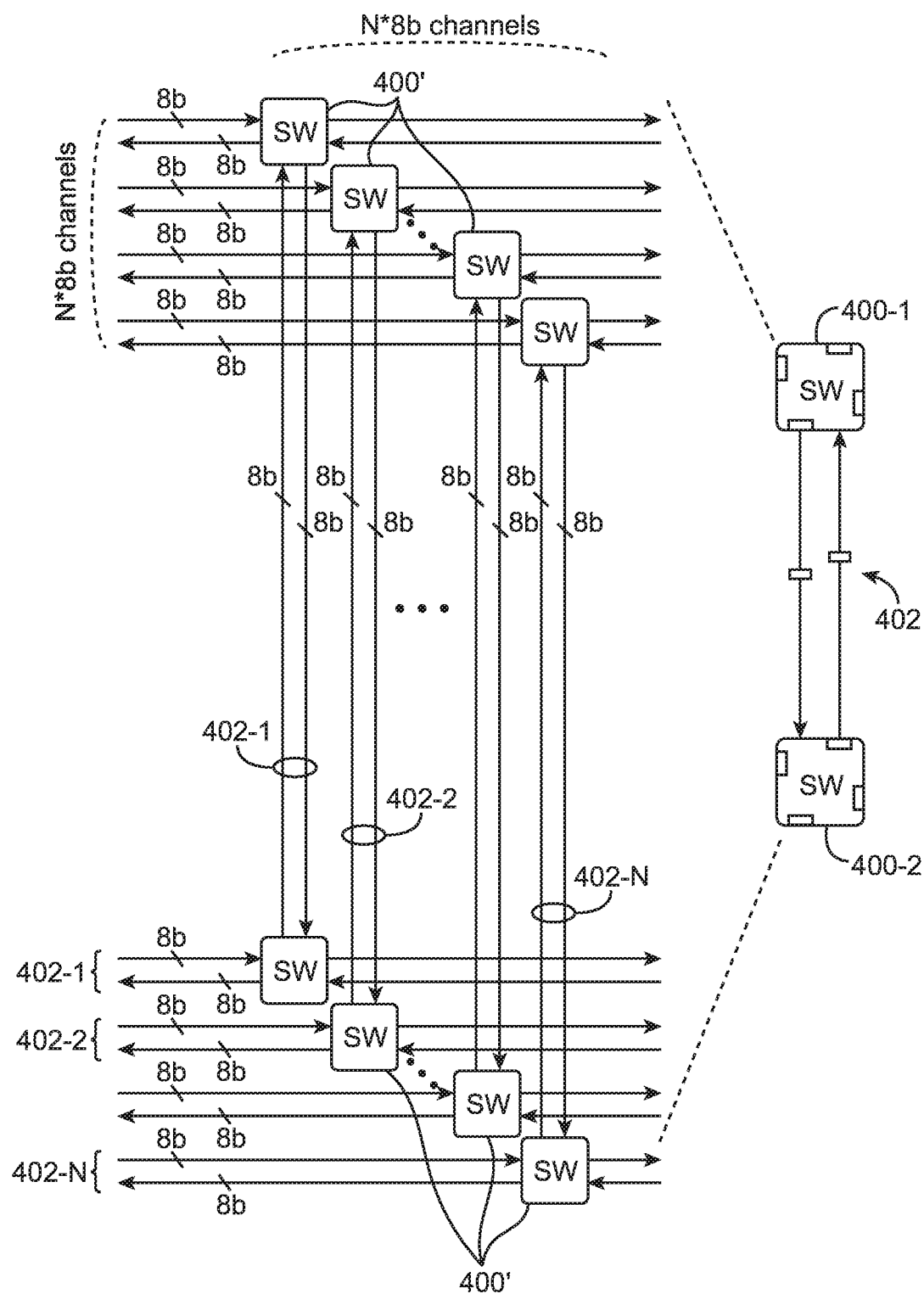
FIG. 5 is a diagram showing how a programmable coarse-grain routing network may be provided with multiple 8-bit channels in accordance with an embodiment.

FIG. 5 is a diagram showing programmable coarse-grain routing network 220 includes multiple 8-bit channels. As shown in FIG. 5, each switch box circuit 400 from FIG. 4 may include multiple instances of N individual switch boxes 400'. Each individual switch box 400' may be coupled to each of four adjacent switch boxes 400' via a set of incoming 8-bit bus and outgoing 8-bit bus. A pair of incoming and outgoing buses form a "channel" of 16 wires (as an example).

In the example of FIG. 5, a first switch box 400' in switch box circuit 400-1 may be coupled to the first switch box 400' in switch box circuit 400-2 via a first channel 402-1; a second switch box 400' in switch box circuit 400-1 may be coupled to the second switch box 400' in switch box circuit 400-2 via a second channel 402-2; . . . ; and an N-th switch box 400' in switch box circuit 400-1 may be coupled to the N-th switch box 400' in switch box circuit 400-2 via an N-th channel 402-N. Channels are routing both in the horizontal direction (linking switch boxes arranged along the same row) and in the vertical direction (linking switch boxes arranged along the same column).

The number of channels N is predetermined. As an example, if N=32, the routing interconnect in each direction would include 256 bits (i.e., 32*8 is equal to 256). Assuming a pipelined interconnect timing closed to 1 GHz, the coarse-grain routing network 220 would then be able to support 32 GBps per direction.

In some embodiments, channel routing may be granular at a byte level and may be bondable into multiple groups. In one suitable arrangement, the coarse-grain routing interconnects may be divided into four independent groups: (1) a first group of 16 channels, (2) a second group of 8 channels, (3) a third group of 4 channels, and (4) a fourth group of 4 channels. This configuration provides four independent networks of 16 GBps, 8 GBps, 4 GBps, and 4 GBps, respectively. A different user design might choose a different allocation of channels based on its unique requirements.

In another suitable arrangement, the coarse-grain routing interconnects may be divided into two independent groups: (1) a first group of 16 channels and (2) a second group of 16 channels. This configuration provides two independent networks each providing 15 GBps. In yet another suitable arrangement, the coarse-grain routing interconnects may be divided into three independent groups: (1) a first group of 16 channels, (2) a second group of 12 channels, and (3) a third group of 4 channels. This configuration provides three independent networks of 16 GBps, 12 GBps, and 4 GBps, respectively.

These channel allocations are merely illustrative. In general, N may be any preselected integer and can be divided into any suitable number of groups depending on the needs of the application. This example in which the allocation is selected among 8-bit buses is merely illustrative. If desired, each bus may carry 4 bits (sometimes referred to as a "word"), 2 bits, 2-8 bits, more than 8 bits, 16 bits 8-16 bits, more than 16 bits, 32 bits, 16-32 bits, more than 32 bits, 64 bits, 32-64 bits, more than 64 bits, or another suitable number of bits.

Each switch box 400' not located at the edge of routing network 220 may include up to four data path routing multiplexers 602 receiving and sending routing channels in each direction (e.g., north to south, south to north, west to east, and east to west). For example, a first data path routing multiplexer 602W may having a first ("0") input connected a horizontal interconnect from the west (W), a second ("1") input coupled to node FN (i.e., the output of multiplexer 602N), a third ("2") input coupled to node FS (i.e., the output of multiplexer 602S), a fourth input ("3") receiving a signal from the FPGA fabric in the top die, and an output driving node FW. The output of data path routing multiplexer 602W may be latched using a corresponding pipeline register 650. Depending on the distance between adjacent switch boxes 400', pipeline registers 650 may be statically bypassed.

Data path routing multiplexer 602W may be controlled using selector multiplexer 604W. Selector multiplexer 604W may have a first ("0") input configured to receive a static control bit from an associated CRAM cell 608W embedded on the top FPGA die, a second ("1") input configured to receive a control signal from the FPGA fabric in the top die, and a third ("2") input configured to receive a count value from a counter circuit such as time domain multiplexing (TDM) counter 606W.

Configured in this way, data path routing multiplexer 602W may select its "0" input to continue the existing signal routing from the west, select between the two perpendicular directional routing channels (i.e., by picking from either the "1" or "2" input), or select data from the FPGA fabric (i.e., by picking the "3" input). Each of the four directions may be arranged in a similar fashion, using second data path routing multiplexer 602N to drive node FN from the north, using third data path routing multiplexer 602E to drive node FE from the east, and using fourth data path routing multiplexer 602S to drive node FS from the south. Multiplexer 602N may be controlled by selector multiplexer 604N. Multiplexer 602E may be controlled by selector multiplexer 604E. Multiplexer 602S may be controlled by selector multiplexer 604S. The detailed wiring and connections are shown in FIG. 6.

Figure 6:
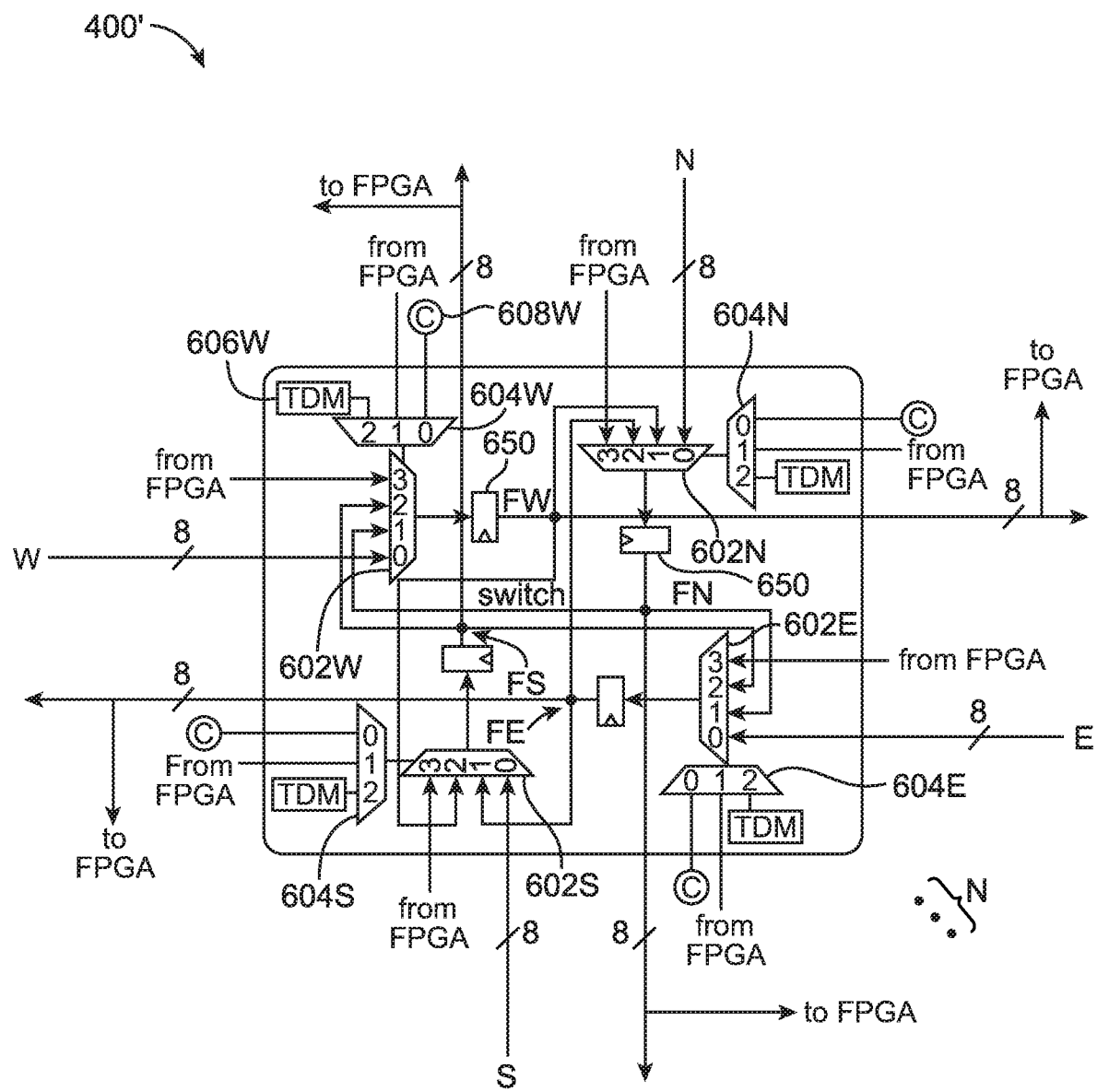
FIG. 6 is a circuit diagram of an illustrative programmable switch box circuit in accordance with an embodiment.
Figure 7:
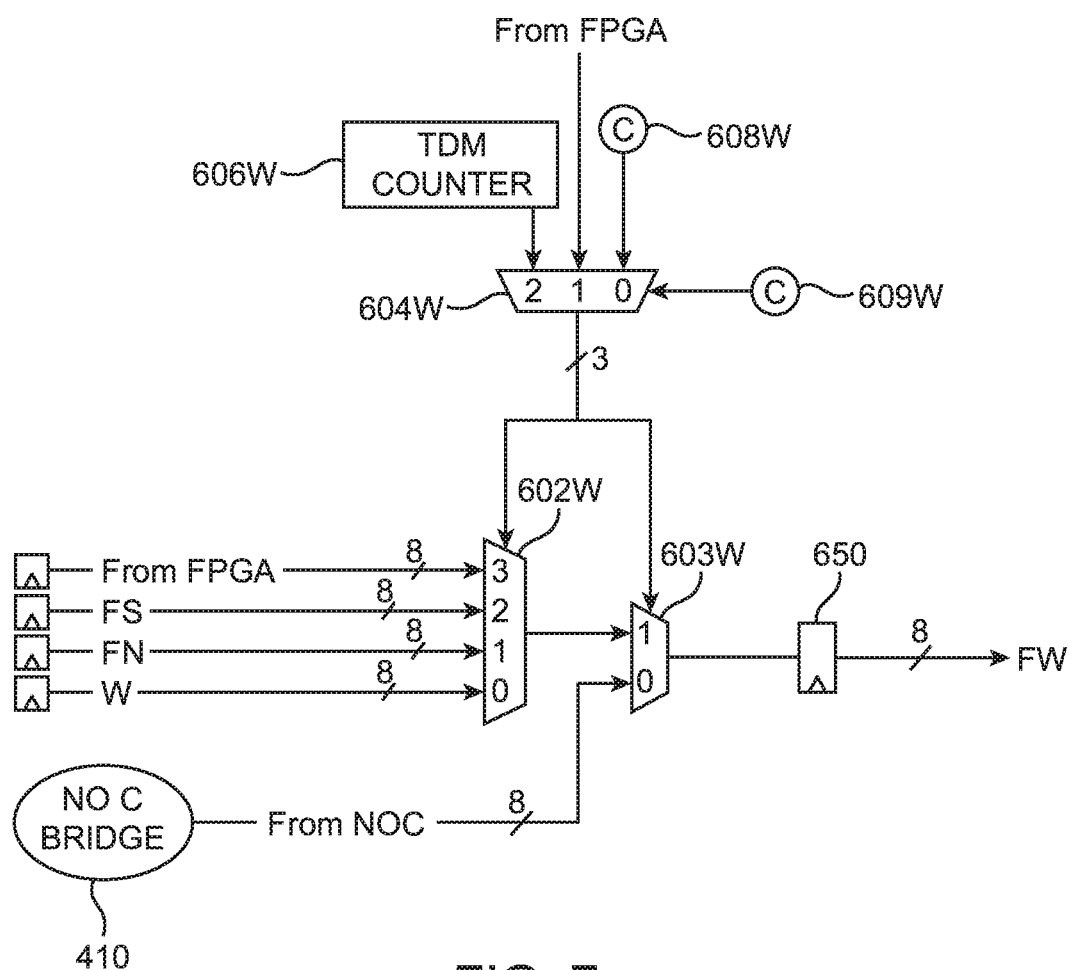
FIG. 7 is a diagram illustrating how a programmable switch box circuit may further be configured to implement a network on chip (NoC) in accordance with an embodiment.

The example of FIG. 6 in which switch box 400' has data path routing multiplexers 602 with 4:1 selectivity is merely illustrative. FIG. 7 illustrates another example where the data path routing multiplexer supports 5:1 selectivity. As shown in FIG. 7, the inputs of routing multiplexer 602W remain the same as those shown in FIG. 6. Note that all inputs of multiplexer 602W may be registered. Multiplexer 602W is further connected to a NoC multiplexer 603W. NoC multiplexer 603W has a first ("1") input connected to the output of data path routing multiplexer 602W, a second ("0") input configured to receive signals from a corresponding NoC bridge 410, and an output that is selectively latched using register pipeline 650 and that drives node FW. In this arrangement, data path routing multiplexer 602W and NoC multiplexer 604W may both be controlled using selector multiplexer 604W, which is shown to be separately controlled by a static control bit from a CRAM cell 609W embedded in the top FPGA die. Each of the four directions may be arranged in a similar fashion to provide access to a higher-level function overlay such as a network on chip.

Figure 8:
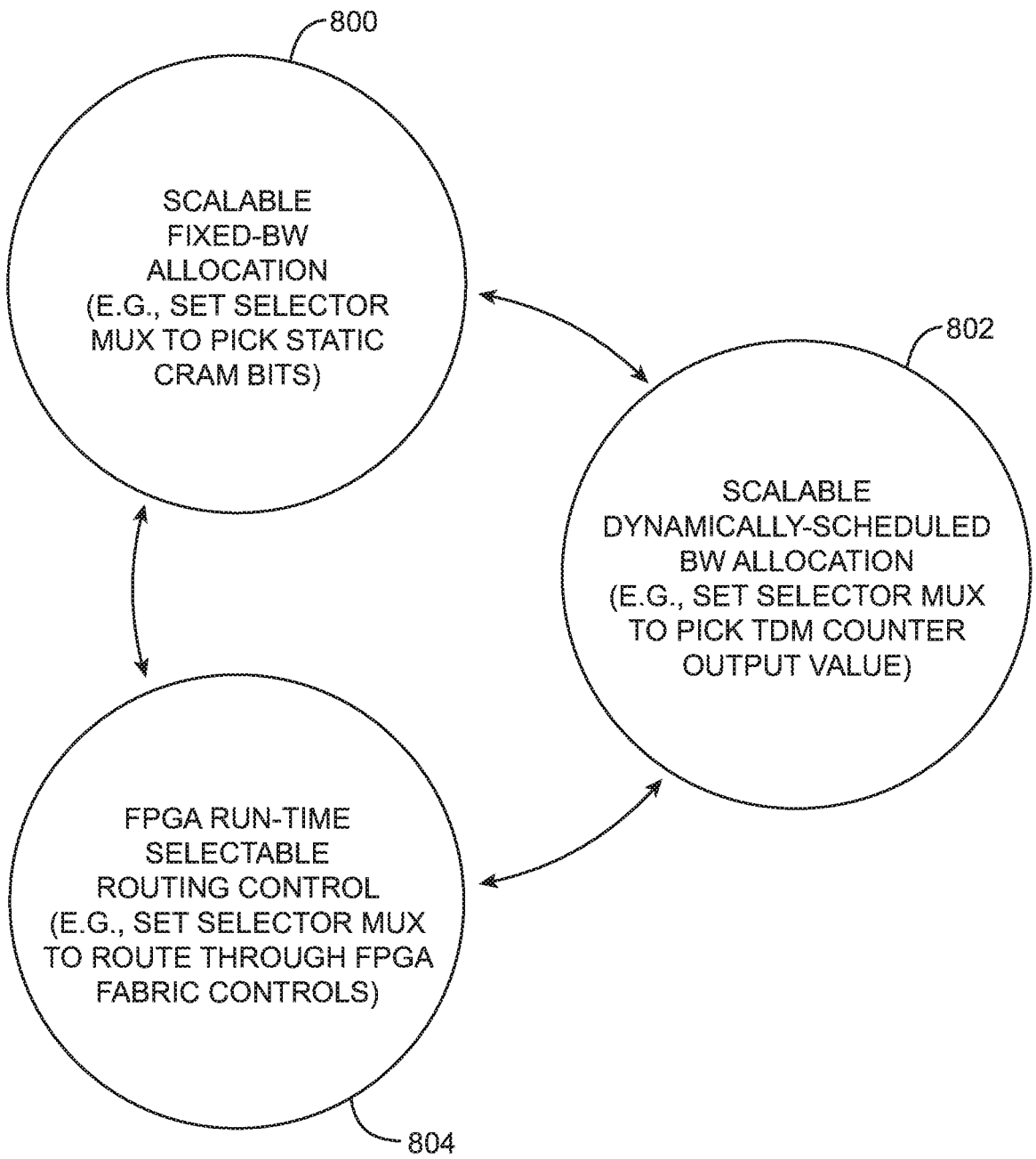
FIG. 8 is a diagram showing various modes in which a programmable coarse-grain routing network can be operated in accordance with an embodiment.

FIG. 8 is a diagram showing various modes in which programmable coarse-grain routing network 220 can be operated. As shown in FIG. 8, coarse-grain routing network 220 may be operating in a first mode 800 during which the bandwidth allocation is fixed, a second mode 802 during which the bandwidth allocation is dynamically scheduled, and a third mode 804 during which the FPGA determines the routing during runtime. During fixed bandwidth allocation mode 800, the N channels can be allocated or bonded into fixed groups, which can be realized by configuring each selector multiplexer 604 to route through the static control bit from CRAM cell 608. Since the value of CRAM cell 608 will stay fixed (at least until it is reconfigured at a later point in time), the routing arrangement should be statically fixed.

During dynamic bandwidth allocation mode 802, selector multiplexer 604 may be configured to pick the count values from TDM counter 606. The TDM counters 606 may be used to dynamically control the configuration of data path routing multiplexers 602 as a function of time. For example, a TDM counter 606 may be used to provide a specific number of S time slots (e.g., 16 time slots), which can be allocated to each data path routing multiplexer 602 to determine the TDM weights and fairness.

Figures 9A, 9B, 9C:
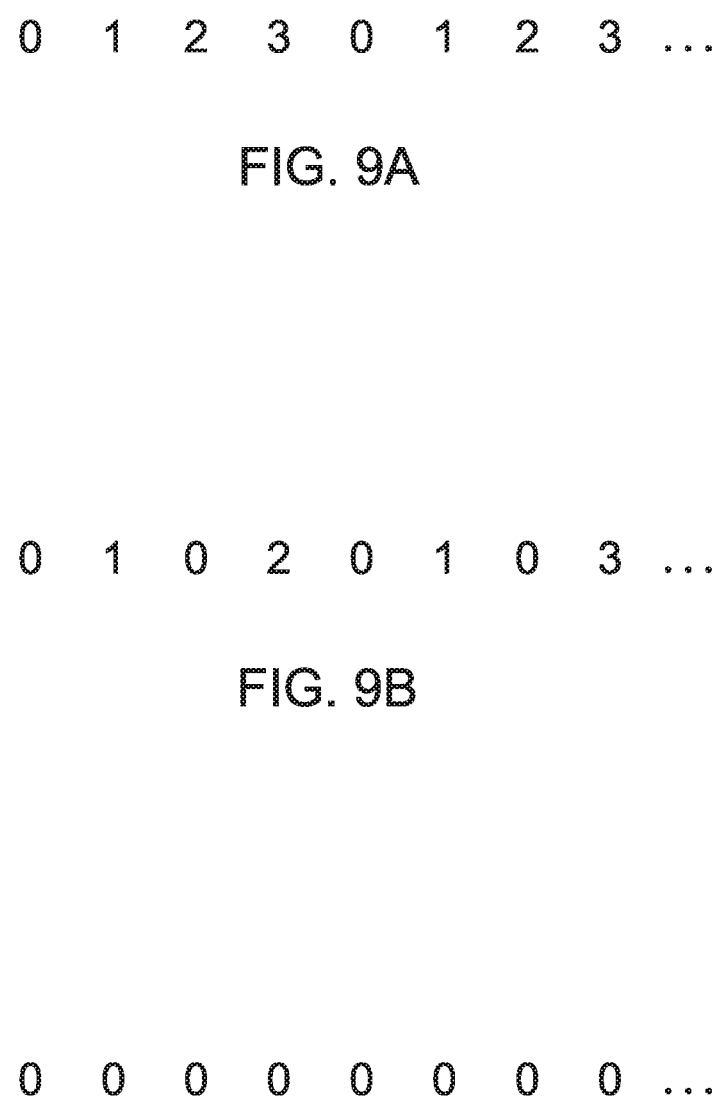

FIGS. 9A, 9B, and 9C are diagrams showing values that can be output by TDM counter 606. FIG. 9A illustrates an example in which the allocation is evenly divided between the four multiplexer inputs (e.g., each input is allocated with a 25% weight). FIG. 9B illustrates another example in which allocation favors the "0" input, followed by the "1" input, and then followed by the "2"/"3" inputs (e.g., the "0" input is given 50% weight, the "1" input is given 25% weight, and the "2"/"3" inputs are each given 12.5% weight). FIG. 9C illustrates yet another example in which allocation is fixed to the "0" input, which is another way of implementing the fixed/static interconnection bandwidth allocation of mode 800. The TDM counter slots may be determined during FPGA compilation time and would be fixed during runtime. If desired, the TDM counter slots may be dynamically adjusted during runtime via some programming interface.

During mode 804, selector multiplexer 604 may be configured to route through the FPGA fabric controls received at input "1". This control mechanism provides a superset of the bandwidth allocation at the expense of user design complexity and a limited amount of FPGA resources. This method could allow control from any type of FPGA "soft" logic, such as a simple static setting that are runtime changeable based on different partial reconfiguration images, deterministic finite state machines, or may even be controlled using a soft central processor unit (CPU) or microcontroller. This type of fabric based dynamic routing control may also be used to provide a fabric loopback connection that includes wires containing early arriving address and/or header information to control and stir subsequent data movement in the coarse-grain routing network 220.

Given the flexible properties of programmable coarse-grain routing network 220, aside from header and data payload movement throughout the network, additional auxiliary channels can be allocated for other purposes (e.g., to convey valid flags, start-of-packets, credit information, other status information, etc.). Coarse-grain routing network 220 does not predefine any particular usage models; rather, this would be determined based on needs of the user application.

Figure 10:
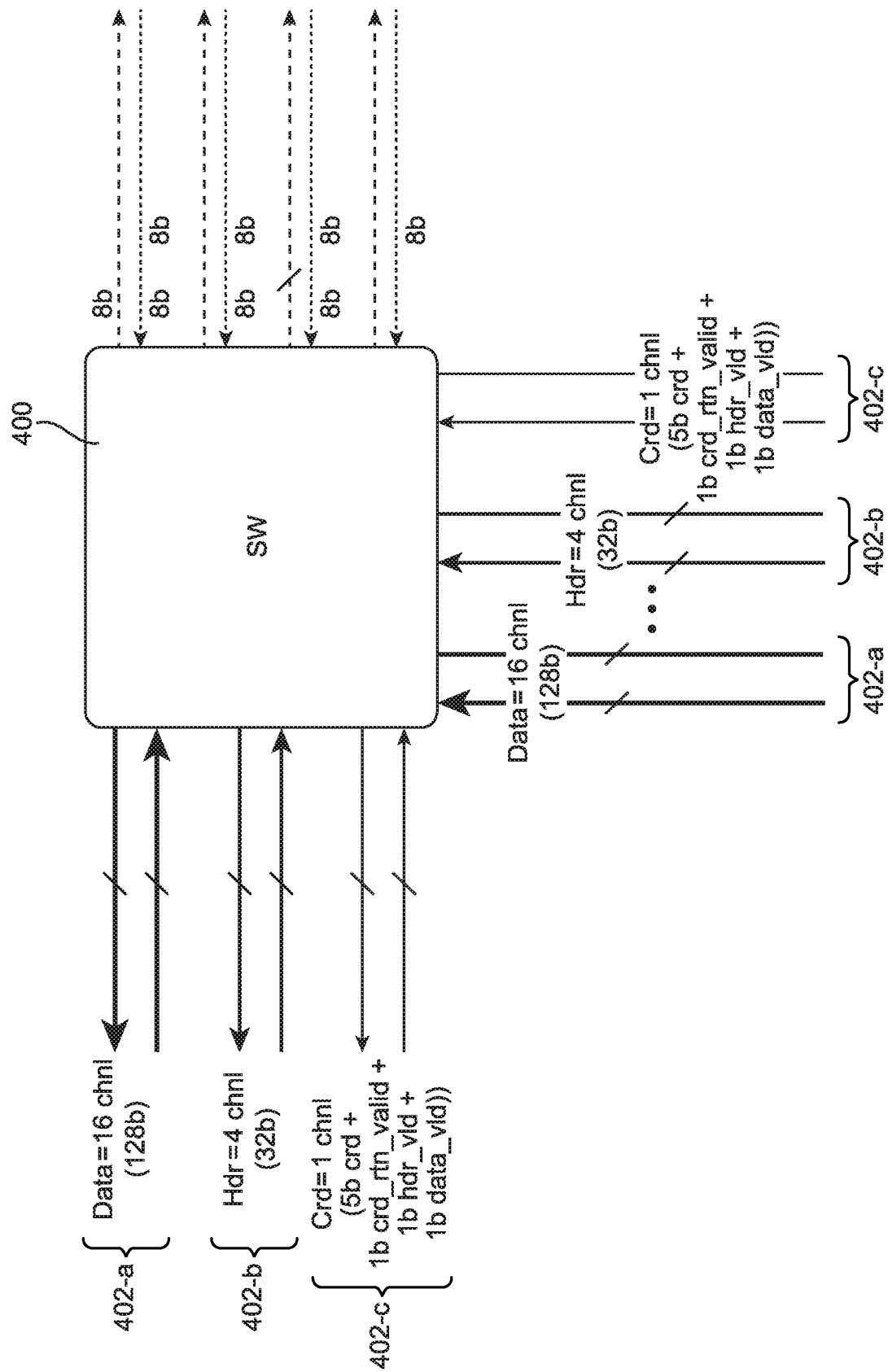
FIG. 10 is a diagram showing how a programmable coarse-grain routing network can be used to implement a credit-based protocol in accordance with an embodiment.

FIG. 10 illustrates an example where coarse-grain routing network 220 is used to implement a credit-based backpressure system. As shown in FIG. 10, sixteen channels 402-a (e.g., 128 bits) are used for data payload in each direction for source to destination, four channels 402-b (e.g., 32 bits) are used to convey header information, and an auxiliary channel 402-c is used to convey a header valid bit, a data valid bit, five credit bits, and a credit return valid bit.

The example of FIG. 10 is merely illustrative and is not intended to limit the scope of the present embodiments. If desired, any group of channels or wires may be logically associated to convey some batch of information deterministically. In another suitable arrangement, auxiliary channels may be used to send timestamp or other packet identification information for synchronization purposes. A global timer could be implemented and an N*8b timestamp could be included alongside the packets moving through the network, which is injected at the source and extracted at the destination. The timestamp information would be checked against the global timer value to determine how long the packet took to traverse the routing network. Local timers may be used in switch box circuits 400 and synchronized using a global reset signal.

In yet another suitable arrangement, the programmable coarse-grain routing network may be used for debugging purposes. For example, a spare/auxiliary channel may be used to convey packet identification and timestamp information, which can then be passed up to the top die and debugged using debugging circuits (e.g., an embedded logic analyzer circuit) in the top die FPGA fabric. These examples are merely illustrative. If desired, coarse-grain routing network may be leveraged or exploited to convey any type of information and/or support any data communications protocol to improve the rate at which data is transferred within and on/off an FPGA.

The embodiments thus far have been described with respect to integrated circuits. The methods and apparatuses described herein may be incorporated into any suitable circuit. For example, they may be incorporated into numerous types of devices such as programmable logic devices, application specific standard products (ASSPs), and application specific integrated circuits (ASICs), microcontrollers, microprocessors, central processing units (CPUs), graphics processing units (GPUs), etc. Examples of programmable logic devices include programmable arrays logic (PALs), programmable logic arrays (PLAs), field programmable logic arrays (FPGAs), electrically programmable logic devices (EPLDs), electrically erasable programmable logic devices (EEPLDs), logic cell arrays (LCAs), complex programmable logic devices (CPLDs), and field programmable gate arrays (FPGAs), just to name a few.

The programmable logic device described in one or more embodiments herein may be part of a data processing system that includes one or more of the following components: a processor; memory; IC circuitry; and peripheral devices. The data processing can be used in a wide variety of applications, such as computer networking, data networking, instrumentation, video processing, digital signal processing, or any suitable other application where the advantage of using programmable or re-programmable logic is desirable. The programmable logic device can be used to perform a variety of different logic functions. For example, the programmable logic device can be configured as a processor or controller that works in cooperation with a system processor. The programmable logic device may also be used as an arbiter for arbitrating access to a shared resource in the data processing system. In yet another example, the programmable logic device can be configured as an interface between a processor and one of the other components in the system.

Although the methods of operations are described in a specific order, it should be understood that other operations may be performed in between described operations, described operations may be adjusted so that they occur at slightly different times or described operations may be distributed in a system which allows occurrence of the processing operations at various intervals associated with the processing, as long as the processing of the overlay operations are performed in a desired way.

For instance, all optional features of the apparatus described above may also be implemented with respect to the method or process described herein. The foregoing is merely illustrative of the principles of this disclosure and various modifications can be made by those skilled in the art. The foregoing embodiments may be implemented individually or in any combination.

What is claimed is:

1. Circuitry, comprising:
    a first circuit that includes fine-grain routing wires; and
    a second circuit that includes a coarse-grain routing network having a plurality of channels forming a deterministic routing path, wherein a first portion of the plurality of channels is used for data payload and wherein a second portion of the plurality of channels is configured to implement an interconnect backpressure mechanism.

2. The circuitry of claim 1, wherein the first circuit is physically mounted above the second circuit.

3. The circuitry of claim 1, wherein the second portion of the plurality of channels that implements the interconnect backpressure mechanism is further configured to convey backpressure credit bits.

4. The circuitry of claim 1, wherein the second portion of the plurality of channels that implements the interconnect backpressure mechanism is further configured to convey a data valid bit.

5. The circuitry of claim 1, wherein the second portion of the plurality of channels is further configured to send timestamp information deterministically.

6. The circuitry of claim 1, wherein the second portion of the plurality of channels is further configured to support debugging operations.

7. Circuitry, comprising:
    a first die that comprises fine-grain routing wires configured to provide a first level of routing granularity; and
    a second die that comprises a coarse-grain routing network configured to provide a second level of routing granularity that is different than the first level of routing granularity, wherein the coarse-grain routing network is further configured at run-time using control signals generated by the first die.

8. The circuitry of claim 7, wherein the first die further comprises programmable logic circuitry configured to generate the control signals.

9. The circuitry of claim 7, wherein the first die further comprises a finite state machine configured to generate the control signals.

10. The circuitry of claim 7, wherein the first die further comprises a soft processor configured to generate the control signals.

11. The circuitry of claim 7, wherein the first die further comprises a microcontroller configured to generate the control signals.

12. The circuitry of claim 7, wherein the coarse-grain routing network comprises a multiplexing circuit having a first data input configured to receive the control signals.

13. The circuitry of claim 12, wherein the multiplexing circuit has a second data input configured to receive signals from a configuration memory cell.

14. The circuitry of claim 13, wherein the multiplexing circuit has a third data input configured to receive signals from a counter.

15. The circuitry of claim 7, wherein the coarse-grain routing network comprises channels configured using a fixed bandwidth allocation.

16. The circuitry of claim 7, wherein the coarse-grain routing network comprises channels configured using a dynamically-scheduled bandwidth allocation.

17. Circuitry, comprising:
    a first circuit that includes fine-grain routing wires; and
    a second circuit that includes a coarse-grain routing network having a plurality of channels forming a deterministic routing path.

18. The circuitry of claim 17, wherein the deterministic routing path exhibits guaranteed timing closure.

19. The circuitry of claim 17, wherein global routing for the first circuit is performed using the coarse-grain routing network in the second circuit.

20. The circuitry of claim 17, wherein the coarse-grain routing network comprises pipeline registers at fixed locations on the second circuit, and wherein register pipelining on the first circuit is adjustable.

* * * * *